(12) United States Patent
Mitsui

(10) Patent No.: US 9,153,419 B2
(45) Date of Patent: Oct. 6, 2015

(54) PATTERN DEFECT INSPECTION USING DATA BASED ON SECONDARY ELECTRON FROM PATTERN

(75) Inventor: Tadashi Mitsui, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 345 days.

(21) Appl. No.: 13/071,360

(22) Filed: Mar. 24, 2011

(65) Prior Publication Data

US 2012/0068065 A1    Mar. 22, 2012

(30) Foreign Application Priority Data

Sep. 21, 2010  (JP) ................. 2010-210920

(51) Int. Cl.
*H01J 37/28* (2006.01)
*H01J 37/22* (2006.01)

(52) U.S. Cl.
CPC .............. *H01J 37/28* (2013.01); *H01J 37/222* (2013.01); *H01J 2237/24592* (2013.01); *H01J 2237/2817* (2013.01)

(58) Field of Classification Search
CPC ......... H01J 37/00; H01J 37/02; H01J 37/147; H01J 37/1471; H01J 37/1472
USPC .......................................... 250/306, 307, 311
See application file for complete search history.

(56) References Cited

U.S. PATENT DOCUMENTS

| | | | | |
|---|---|---|---|---|
| 4,958,074 A | * | 9/1990 | Wolf et al. | 250/309 |
| 5,276,325 A | * | 1/1994 | Todokoro et al. | 250/310 |
| 5,717,204 A | * | 2/1998 | Meisburger et al. | 250/310 |
| 6,313,476 B1 | * | 11/2001 | Shimizu et al. | 250/492.22 |
| 6,815,675 B1 | * | 11/2004 | Lorusso et al. | 250/307 |
| 7,889,909 B2 | * | 2/2011 | Shindo et al. | 382/145 |
| 2004/0075458 A1 | * | 4/2004 | Rashkovan et al. | 324/765 |
| 2005/0184235 A1 | * | 8/2005 | Abe | 250/311 |
| 2005/0205781 A1 | * | 9/2005 | Kimba | 250/311 |
| 2006/0054813 A1 | * | 3/2006 | Nokuo et al. | 250/307 |
| 2007/0210252 A1 | * | 9/2007 | Miyamoto et al. | 250/310 |
| 2008/0073528 A1 | * | 3/2008 | Sasaki et al. | 250/307 |
| 2008/0315093 A1 | * | 12/2008 | Hasegawa et al. | 250/310 |
| 2009/0002695 A1 | * | 1/2009 | Saito et al. | 356/237.4 |
| 2009/0039263 A1 | * | 2/2009 | Matsuoka et al. | 250/311 |
| 2009/0200465 A1 | * | 8/2009 | Sutani et al. | 250/311 |
| 2009/0242760 A1 | * | 10/2009 | Miyamoto et al. | 250/307 |

(Continued)

FOREIGN PATENT DOCUMENTS

JP      09-312318      12/1997

*Primary Examiner* — Jack Berman
*Assistant Examiner* — Jason McCormack
(74) *Attorney, Agent, or Firm* — Finnegan, Henderson, Farabow, Garrett & Dunner, L.L.P.

(57) ABSTRACT

A pattern defect inspection method includes generating electron beam irradiation point track data on the basis of first data on an inspection target pattern, irradiating the electron beam to the inspection target pattern in accordance with the electron beam irradiation point track data, detecting secondary electrons generated from the inspection target pattern due to the irradiation of the electron beam, acquiring second data regarding a signal intensity of the secondary electrons from a signal of the detected secondary electrons, and detecting an abnormal point from the second data and outputting the abnormal point as a defect of the inspection target pattern. The electron beam irradiation point track data includes data on a track of irradiation points of an electron beam to the inspection target pattern and is intended to control over scanning with the electron beam, the electron beam irradiation point track data.

22 Claims, 13 Drawing Sheets

(56) References Cited

U.S. PATENT DOCUMENTS

2009/0272899 A1* 11/2009 Yamazaki et al. ............ 250/307
2010/0136717 A1* 6/2010 Shin et al. ....................... 438/14
2010/0177952 A1 7/2010 Mitsui
2010/0303361 A1 12/2010 Mitsui
2011/0155905 A1* 6/2011 Hatakeyama et al. ........ 250/307
2011/0240852 A1* 10/2011 Tanner .......................... 250/307

* cited by examiner

| EDGE LINE GROUP PAIR | SHAPE CONFORMITY DEGREE | DISTRIBUTION VALUE |
|---|---|---|
| COMBINATION OF (EG1 TO EG8, EG9 TO EG16) | 0.533416 | 70.099947 |
| GIVEN COMBINATION OTHER THAN ABOVE | 0.244051 | 2460.834574 |

FIG.20

PATTERN DEFECT INSPECTION USING DATA BASED ON SECONDARY ELECTRON FROM PATTERN

CROSS REFERENCE TO RELATED APPLICATIONS

This application is based upon and claims the benefit of priority from the prior Japanese Patent Application No. 2010-210920, filed on Sep. 21, 2010, the entire contents of which are incorporated herein by reference.

FIELD

Embodiments described herein relate generally to a pattern defect inspection apparatus and a pattern defect inspection method.

BACKGROUND

A defect inspection of a micropattern formed in a semiconductor device manufacturing process such as a lithography process or etching process is described as an example of a conventional pattern defect inspection.

In response to recent increasing miniaturization of semiconductor patterns, defects that affect the performance of a semiconductor product have been decreasing in size. It has become increasingly difficult to defect such small-sized defects by conventional inspection apparatuses.

An inspection apparatus that has hitherto been in wide use acquires optical images or SEM images, and compares these inspection images with a reference pattern to defect defects. There are principles used for general defect inspection apparatuses; for example, a die-to-die method that uses, as a reference pattern, a die adjacent to an inspection pattern, and die-to-database method that uses design data as a reference pattern.

These inspection techniques vary in advantages and disadvantages depending on whether the inspection images are optical images or SEM images. The inspection based on the optical images allows a high throughput, but has the disadvantage of insufficient resolution for the detection of micro defects. On the other hand, the inspection based on the SEM images provides sufficient resolution but a low throughput. Therefore, the inspection based on the SEM images is not practically used for the inspection of the entire surface of a wafer at present, and is generally used for the inspection of an area that accounts for several percent of the entire wafer surface.

However, in order to predict an accurate product yield, it is desirable to increase the inspection area of a wafer to several ten percent which is equal to that in the optical inspection. Accordingly, various attempts have been made to increase the speed of the inspection based on the SEM images. While the SEM images are acquired by raster scans with an electron beam, the problem is that simply reducing the image acquiring time does not allow for an S/N of an image sufficient for a reliable inspection.

In the meantime, the inspection based on the SEM images allows the acquiring time of the SEM image to be reduced if an electron beam current amount is increased. However, the problem is that a charging phenomenon is induced and a desired image is not obtained when the electron beam current amount is simply increased. There has been suggested a technique that uses a mapping projection optical system to acquire the inspection images instead of using the raster scan for the image acquisition. However, this technique provides low image resolution and is disadvantageous to the detection of micro defects.

BRIEF DESCRIPTION OF THE DRAWINGS

In the accompanying drawings:

FIG. 20 is a table showing a specific example of matching scores in shape matching.

DETAILED DESCRIPTION

Embodiments will now be explained with reference to the accompanying drawings.

While a defect inspection of a micropattern formed in a semiconductor device manufacturing process is described by way of example in the following embodiments, it is to be noted that the present invention is not limited to the semiconductor device and is generally applicable to pattern defect inspections in various other industrial fields.

It is also to be noted that the term "pattern" in the specification of the present irradiation is used to represent not only a convex pattern but also a concave pattern. The reason is as follows: For example, when a plurality of convex portions projecting upward from a substrate are formed by patterning a material formed on the surface of the substrate, the convex portions are regarded as convex patterns. Meanwhile, adjacent convex portions and a substrate surface area between these convex portions are regarded as a concave pattern. Thus, the substrate surface area between the adjacent convex portions can be regarded as the bottom of the concave pattern. In the following embodiments, the convex pattern corresponds to, for example, a first pattern, and the concave pattern corresponds to, for example, a second pattern.

In general, according to one embodiment, a pattern defect inspection method includes generating electron beam irradiation point track data on the basis of first data on an inspection target pattern, irradiating the electron beam to the inspection target pattern in accordance with the electron beam irradiation point track data, detecting secondary electrons generated from the inspection target pattern due to the irradiation of the electron beam, acquiring second data regarding a signal intensity of the secondary electrons from a signal of the detected secondary electrons, and detecting an abnormal point from the second data and outputting the abnormal point as a defect of the inspection target pattern. The electron beam irradiation point track data includes data on a track of irradiation points of an electron beam to the inspection target pattern and is intended to control over scanning with the electron beam, the electron beam irradiation point track data.

(1) First Embodiment of Pattern Defect Inspection Apparatus

Figure 1:
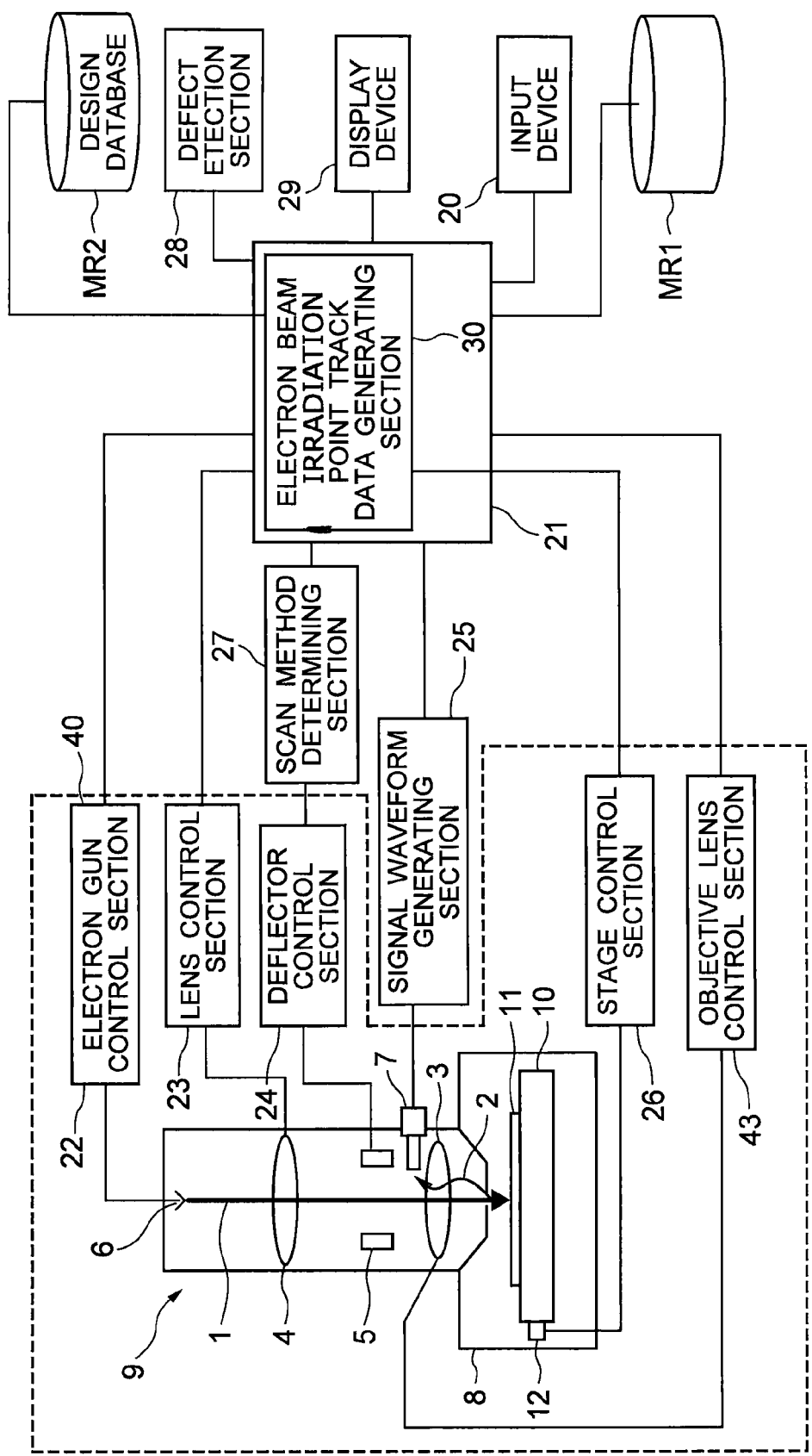
FIG. 1 is a block diagram showing a schematic configuration of a pattern defect inspection apparatus according to a first embodiment.

FIG. 1 is a block diagram showing a schematic configuration of a pattern inspection apparatus according to a first embodiment. The pattern inspection apparatus shown in FIG. 1 comprises a scanning electron microscope (critical dimension-scanning electron microscope (CD-SEM)) 40, a control computer 21, external memories MR1 and MR2, a scan method determining section 27, a signal waveform generating section 25, a defect detection section 28, a display device 29, and an input device 20.

The control computer 21 includes an electron beam irradiation point track data generating section 30. The control computer 21 is connected not only to the scanning electron microscope 40 but also to the scan method determining section 27, the signal waveform generating section 25, the defect detection section 28, the display device 29, the input device 20, and the memories MR1 and MR2.

CAD data for an inspection target pattern is stored in the memory MR2. The CAD data corresponds to, for example, first data in the present embodiment. A recipe file in which a procedure of a later-described pattern inspection method is described is stored in the memory MR1. The control computer 21 reads this recipe file to conduct a pattern defect inspection.

The electron beam irradiation point track data generating section 30 extracts the CAD data from the memory MR2, and performs later-described data processing to generate electron beam irradiation point track data. The electron beam irradiation point track data comprises data regarding a track of points of irradiation of an electron beam to the inspection target pattern, and is intended to control scanning with the electron beam. The generated electron beam irradiation point track data is sent to a stage control section 26. In the present embodiment, the electron beam irradiation point track data generating section 30 corresponds to, for example, an electron beam irradiation point track data generating unit.

In the present embodiment, the scanning electron microscope 40 corresponds to, for example, an electron beam irradiation unit, and comprises a lens barrel 9, a sample chamber 8, an electron gun control section 22, a condenser lens control section 23, a deflector control section 24, the stage control section 26, and an objective lens control section 43. The lens barrel 9 is provided with an electron gun 6, a condenser lens 4, a deflector 5, an objective lens 3, and a secondary electron detector 7. A stage 10 and an actuator 12 are provided in the sample chamber 8. The stage 10 supports a substrate 11 that is a sample in which the inspection target pattern is formed.

The control computer 21 is also connected to the electron gun control section 22, the condenser lens control section 23, the stage control section 26, and the objective lens control section 43. The control computer 21 is connected to the deflector control section 24 via the scan method determining section 27, and also connected to the secondary electron detection section 7 via the signal waveform generating section 25.

The electron gun control section 22 is connected to the electron gun 6 in the lens barrel 9. The condenser lens control section 23 is connected to the condenser lens 4. The deflector control section 24 is connected to the deflector 5. The objective lens control section 43 is connected to the objective lens 3. The stage control section 26 is connected to the actuator 12 in the sample chamber 8.

The electron gun control section 22 generates a control signal under the instruction of the control computer 21. In response to this control signal, the electron gun 6 emits an electron beam 1.

The objective lens control section 43 generates a control signal in accordance with an instruction signal sent from the control computer 21, and adjusts the focal position of the objective lens in response to the control signal. The electron beam 1 emitted from the electron gun 6 is condensed by the condenser lens 4, and then irradiated to the substrate 11 through the objective lens 3.

The condenser lens control section 23 generates a control signal in accordance with an instruction signal sent from the control computer 21. In response to this control signal, the condenser lens 4 condenses the electron beam 1. The deflector control section 24 generates a control signal under the instruction of the control computer 21. The deflector 5 forms a deflected electric field or deflected magnetic field in accordance with an instruction signal sent from the deflector control section 24, and thereby suitably deflects the electron beam 1 in an X direction and a Y direction to scan the surface of the substrate 11.

The stage 10 is movable in the X direction and the Y direction. The actuator 12 moves the stage 10 in accordance with a control signal generated by the stage control section 26 in response to an instruction from the control computer 21. Thus, an inspection area FOV (field of view) is scanned with the electron beam.

The scanning electron microscope 40 has a configuration capable of scanning by both a raster scan method and a vector scan method. The scan method determining section 27 determines a scan method in accordance with a control signal from the control computer 21, and then sends a selection signal to the deflector control section 24. In accordance with the sent selection signal, the deflector control section 24 controls the deflector by the selected scan method. When the scan method determining section 27 selects the raster scan method, the electron beam irradiation point track data is supplied from the electron beam irradiation point track data generating section 30, and the electron beam irradiation point track data generating section 30 generates a control signal so that the electron beam is radiated in accordance with the electron beam irradiation point track data.

The scanning electron microscope 40 also has an unshown variably shaping aperture, and functions to generate a variably shaped beam.

Secondary electrons are generated from the surface of the substrate 11 by the irradiation of the electron beam 1, and detected by the secondary electron detector 7 such that a detection signal is output to the signal waveform generating section 25. The signal waveform generating section 25 processes the detection signal from the secondary electron detector 7 to create signal waveform data that represents a one-dimensional intensity distribution of the detection signal, and sends the signal waveform data to the control computer 21.

The control computer 21 sends, to the defect detection section 28, the signal waveform data sent from the signal waveform generating section 25, and causes a signal waveform to be displayed by the display device 29 and stored in the memory MR1. In the present embodiment, the secondary electron detector 7 corresponds to, for example, a secondary electron detection unit, and the signal waveform generating section 25 corresponds to, for example, a signal intensity acquisition unit. Moreover, the signal waveform data corresponds to, for example, second data in the present embodiment.

The defect detection section 28 corresponds to, for example, a defect detection unit in the present embodiment. The defect detection section 28 analyzes the one-dimensional signal waveform data sent from the control computer 21, and thereby detects abnormal points. The defect detection section 28 sends a detection result as a defect of the inspection target pattern to the control computer 21. The control computer 21 causes the sent defect information to be displayed by the display device 29 and stored in the memory MR1.

The input device 20 is an interface for inputting, to the control computer 21, information such as the coordinate position of the inspection area FOV, the kind of the inspection pattern, inspection conditions, and various thresholds for defect detection. The various thresholds include, for example, the value of the distance from the most adjacent edge for determining a part to be excluded from a frame line generation target in the bottom of a concave pattern in a later-described second embodiment, the values of a line width and a space width in a fourth embodiment, and a threshold for edge detection in a fifth embodiment.

Now, several embodiments of the pattern inspection method that uses the pattern inspection apparatus shown in FIG. 1 are described with reference to FIG. 2 to FIG. 8.

(2) First Embodiment of Pattern Defect Inspection Method

A schematic procedure of a pattern defect inspection method according to the present embodiment is described with reference to a flowchart in FIG. 2.

First, the electron beam irradiation point track data generating section 30 extracts CAD data from the memory MR2, and generates electron beam irradiation point track data from the CAD data (step S1).

The scan method determining section 27 then adopts the vector scan method to set the deflector control section 24 for the vector scan. In accordance with the electron beam irradiation point track data sent from the electron beam irradiation point track data generating section 30, the stage control section 26 drives the stage 10, and the electron gun 6 generates an electron beam and irradiates the electron beam to an inspection pattern (step S2).

The secondary electron detector 7 then detects secondary electrons generated from the inspection target pattern, and sends a detection result to the signal waveform generating section 25. The signal waveform generating section 25 creates an intensity distribution of a signal waveform corresponding to coordinate information based on a scan start point. The signal waveform generating section 25 sends the created data to the defect detection section 28 via the control computer 21 as a one-dimensional signal waveform (step S3).

The defect detection section 28 analyzes the sent one-dimensional signal waveform data, and thereby detects in the inspection target pattern (step S4). Information regarding the defected detects is displayed on, for example, a display by the display device 29 via the control computer 21, and also stored and recorded in the memory MR1 (step S5).

The control computer 21 performs the above-described series of defect detection for the whole inspection area FOV.

Now, the pattern defect inspection method according to the present embodiment is more specifically described with reference to FIG. 3 to FIG. 8.

(i) Generation of Electron Beam Irradiation Point Track Data

Figure 3:
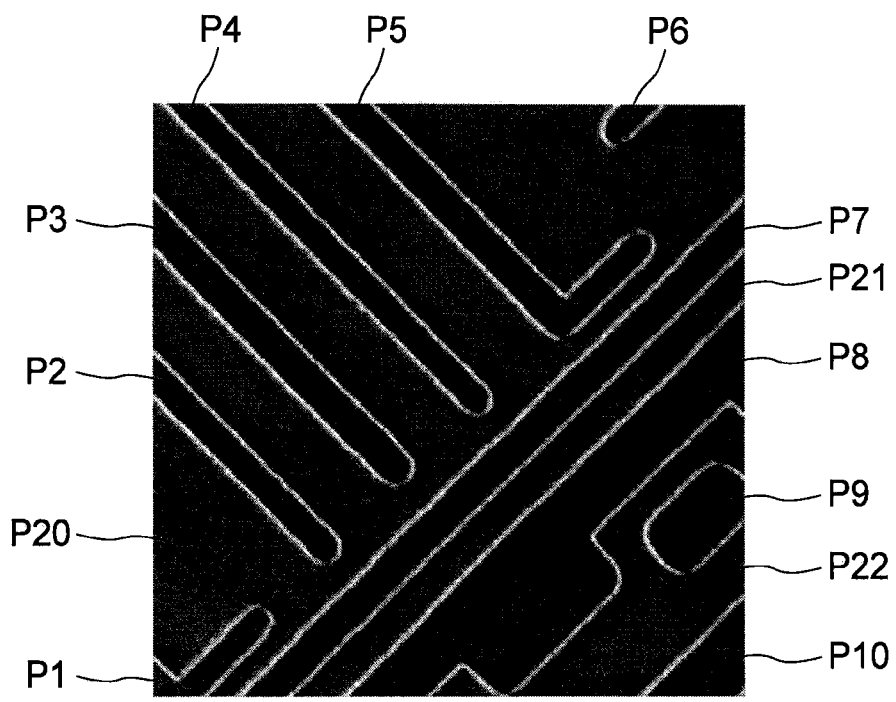
FIG. 3 is an SEM image showing an example of an inspection target pattern.

FIG. 3 is an SEM image showing an example of an inspection target pattern. In the example of FIG. 3, convex patterns P1 to P10 are shown. A space between the edges of the convex patterns P1 to P7 constitutes the bottom of a concave pattern P20. Similarly, a space between the convex patterns P7 and P8 constitutes the bottom of a concave pattern P21, and a space between the convex patterns P8 to P10 constitutes the bottom of a concave pattern P22.

Figure 4:
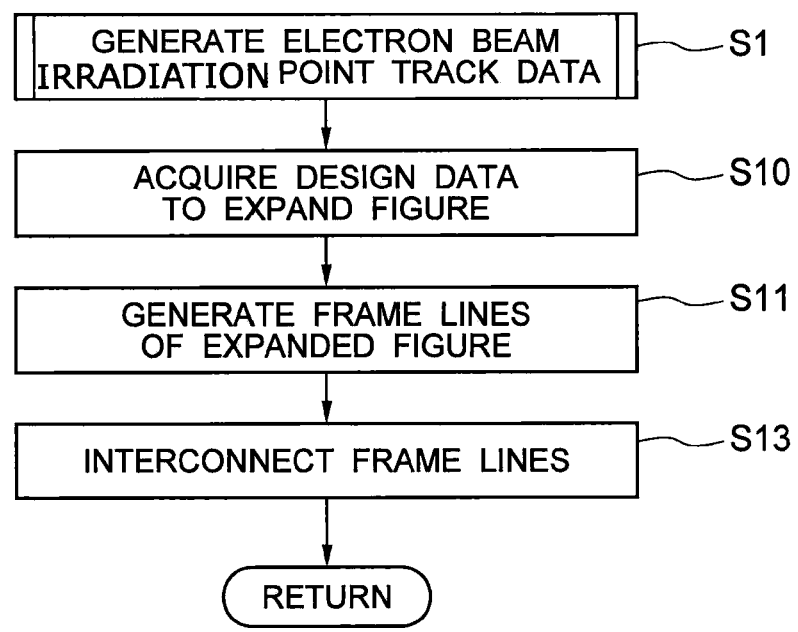
FIG. 4 is a flowchart showing a specific method of generating electron beam irradiation point track data in the flowchart shown in FIG. 2.

FIG. 4 is a flowchart showing a method of generating electron beam irradiation point track data according to the present embodiment. In the present embodiment, design data corresponding to the inspection target pattern is used to generate the electron beam irradiation point track data. While the design data is generated in various file formats, binary data such as GDS is used in the present embodiment. Thus, the electron beam irradiation point track data generating section 30 expands the binary data to acquire a figure shown in FIG. 5 (FIG. 4, step S10).

Furthermore, the electron beam irradiation point track data generating section 30 generates frame lines of the expanded figure (FIG. 4, step S11). Here, the frame line of the figure represents a set of points equally distant from the edge of the figure, and is also referred to as a central axis of the figure.

While various techniques to extract the frame of the figure have been suggested, a technique that uses distance transformation is used in the present embodiment. The distance transformation is a process for converting the value of a pixel in the figure to a minimum distance from the pixel to the edge of the figure. As a result of this distance transformation, the frame of the figure can be extracted as a local maximum value of a distance transformation image.

Figure 5:
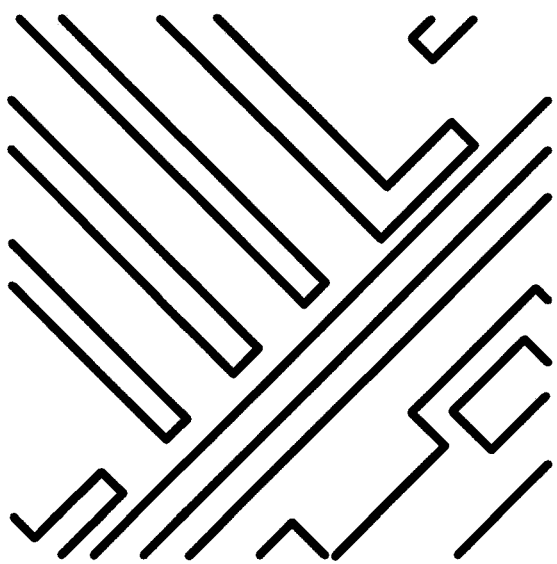
FIG. 5 is a diagram showing an example of the expansion of CAD data corresponding to the inspection target pattern in FIG. 3.
Figure 6:
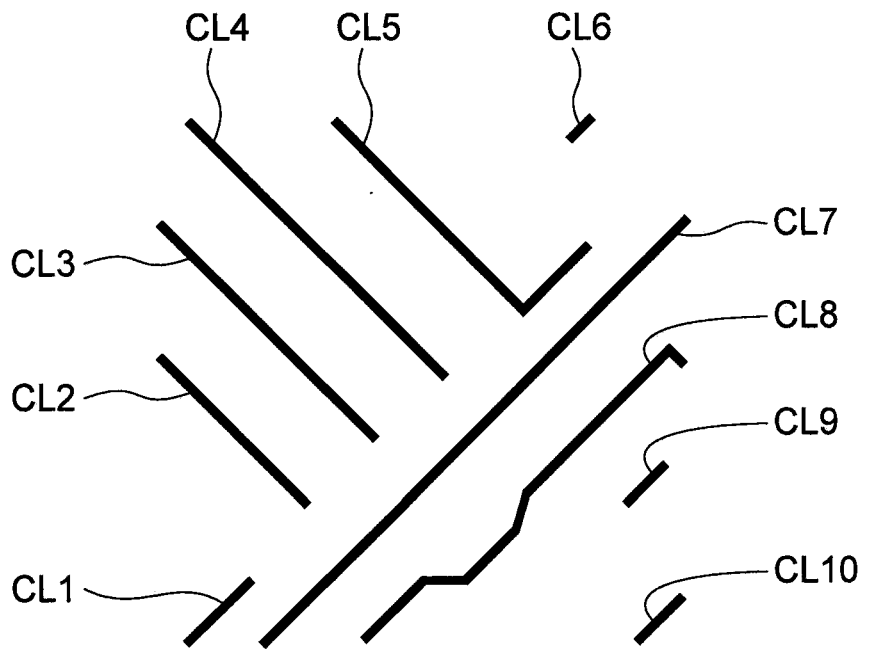
FIG. 6 is a diagram showing an example of frame lines generated by processing the expanded figure in FIG. 5.

FIG. 6 shows an example of frame lines generated by processing the expanded figure in FIG. 5. In the example of FIG. 6, frame lines CL1 to CL10 extracted from the expanded figure corresponding to the convex patterns P1 to P10 in FIG. 3 are shown.

In order to form the frame lines generated in step S11 into electron beam irradiation point track data for an electron beam, the frame lines have to be connected after the order of electron beam scans is determined. An example of electron beam tracks thus formed is shown in FIG. 7.

Figure 7:
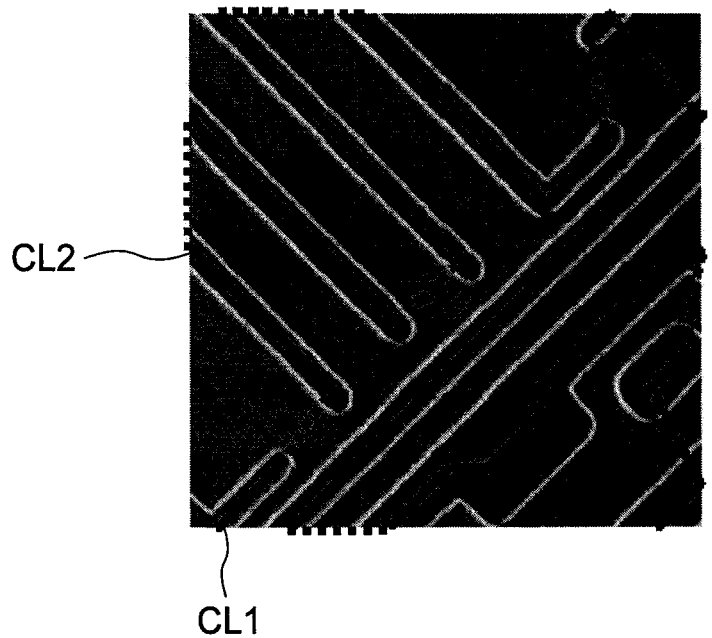
FIG. 7 is a diagram showing an example of tracks of electron beam irradiation points.

In the example of FIG. 7, dotted lines represent parts that connect the frame lines, and no electron beam is actually irradiated to such parts. This can be achieved by known means, for example, by providing an electron beam optical system of the scanning electron microscope 40 with a shutter which is obtained by, for example, beam blanking.

An irradiation path of the electron beam is desirably minimized to reduce an inspection time. This is generally considered to be an irradiation of a problem known as a traveling salesman problem. Therefore, when there are a small number of frame lines, a solution can be found by selecting the minimum irradiation path from all of the calculated combinations. However, a calculation load is heavy when the number of frame lines is great. It is not practical to go that far to find a minimum path. Accordingly, there has been suggested a method for an approximate solution of the traveling salesman problem.

Here, in an actual inspection, a dose amount of the (primary) electron beam that allows sufficiently detectable secondary electrons to be emitted has to be obtained in solid-line portions of the frame lines shown in FIG. 7. Therefore, a speed equal to or more than a given speed cannot be set as the movement speed of a beam. However, the beam is characterized by being able to move at the maximum beam deflection speed in dotted-line portions where there is no irradiation of the beam. Under such circumstances, it is not much worth imposing an excessive load to find a minimum path for an electron beam scan.

Thus, the following technique is selected in the present embodiment: Starting with the frame line CL1 located in the lower left of FIG. 7, frame lines proximate to each other among unconnected frame lines are simply connected to generate electron beam irradiation point track data.

Although the generated electron beam irradiation point track data may be recorded in the memory MR1 as a general format such as the GDS, a simple format such as a G-code is used in the present embodiment. The G-code is a format used to describe the movement of working tools and the setting of a coordinate system in NC processing equipment, and is like a procedure shown in the NC processing equipment. In the G-code, a two-digit number following G indicates its function. There are actually 100 kinds of G-codes ranging from G00 to G99.

In the present embodiment, description similar to the G-code is used for the linear interpolation function of positioning an initial electron beam irradiation point indicated by G00 and moving, at a specified movement speed, an electron beam track on a straight line that connects a starting point of beam irradiation indicated by G01 to an end point. For example, the electron beam irradiation point track data is described, for example, as follows:

G00 X100 Y100
G01 X150 Y100 FV1

The above example represents that the electron beam is radiated at a speed V1 from coordinates (100, 100) to coordinates (150, 100). Here, the speed V1 is a set parameter in the apparatus corresponding to a scan speed, and an actual speed does not always have to be described as a numerical value.

Figure 2:
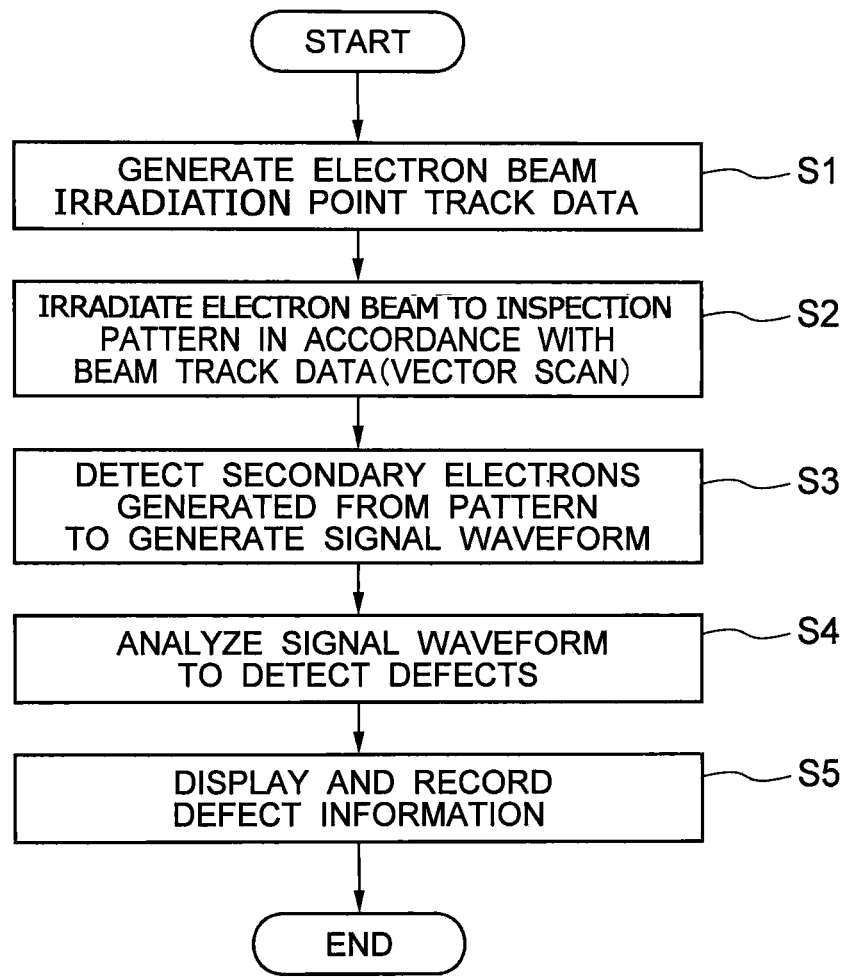
FIG. 2 is a flowchart showing a schematic procedure of a pattern defect inspection method according to the first embodiment.

(ii) Vector Scan (FIG. 2, step S2)

Furthermore, the electron beam is irradiated to an actual inspection target pattern on the substrate 11 in accordance with the electron beam irradiation point track data generated by the above-described procedure. This can be achieved by using a known CAD navigation technique.

Such a beam irradiation method is referred to as the vector scan. Various means for enabling this method are suggested, and there are commercially available apparatuses based on these suggestions on the market. Such apparatuses are only pattern manufacturing apparatuses that use an electron beam. In contrast, it should be understood that the means according to the present embodiment is intended for the pattern defect inspection.

For the observation of the pattern, the spot size of the electron beam needs to be minimized to improve the resolution of an image. In the present embodiment, the spot size is preferably equal to or less than the width of a pattern to detect defects in the pattern with high sensitivity. In the present embodiment, the width of the pattern, for example, shown in FIG. 3 is about 20 nm, so that the spot diameter of the electron beam is 10 nm which is half the width of the pattern.

(iii) Acquisition of One-Dimensional Signal Waveform (FIG. 2, Step S3)

Secondary electrons are generated from the pattern to which the electron beam is irradiated in the procedure of step S2. The secondary electron detector 7 detects the generated secondary electrons, and sends a detection signal to the signal waveform generating section 25. The signal waveform generating section 25 amplifies the intensity of the sent detection signal, and then creates an intensity distribution of a signal waveform corresponding to coordinate information based on a scan start point. The signal waveform generating section sends the data to the control computer 21 as a one-dimensional signal waveform (step S3).

The control computer 21 sends the sent one-dimensional signal waveform data to the defect detection section 28, and also sends the data to the memory MR1 and records the data in the memory MR1. The detection signal from the secondary electron detector 7 is used to form a normal two-dimensional pattern image in the raster scan. Since the vector scan is used in the present embodiment, forming the detection signal as an image is meaningless, so that the detection signal is output as a signal waveform in a one-dimensional form and analyzed by the defect detection section 28.

(iv) Defect Detection by Analysis of One-Dimensional Signal Waveform (FIG. 2, Step S4)

As the electron beam is only irradiated to a part where there is a pattern in the present embodiment, the intensity of the secondary electrons has to be always constant if the pattern is normal. However, when there are defects in the pattern, such as fractures or adhesion of foreign objects, the signal intensity of the secondary electrons changes in parts corresponding to the defect positions.

The defect detection section 28 detects such a change in the sent secondary electron signal waveform. For the detection of the change, a known peak detection algorithm can be irradiated; for example, a differentiated waveform of the signal waveform is calculated, and a change point is found from the intensity. In the present embodiment, a finite impulse response (FIR) filter is used for peak detection.

The defect detection section 28 then outputs the number of detected peaks as the number of defects. As the horizontal axis of the secondary electron signal waveform can be checked against beam irradiation data and thereby converted to coordinates on the pattern, defect positions can be output thereby. Moreover, for example, the half-value width of a peak can be output as the size of a defect.

Figure 8:
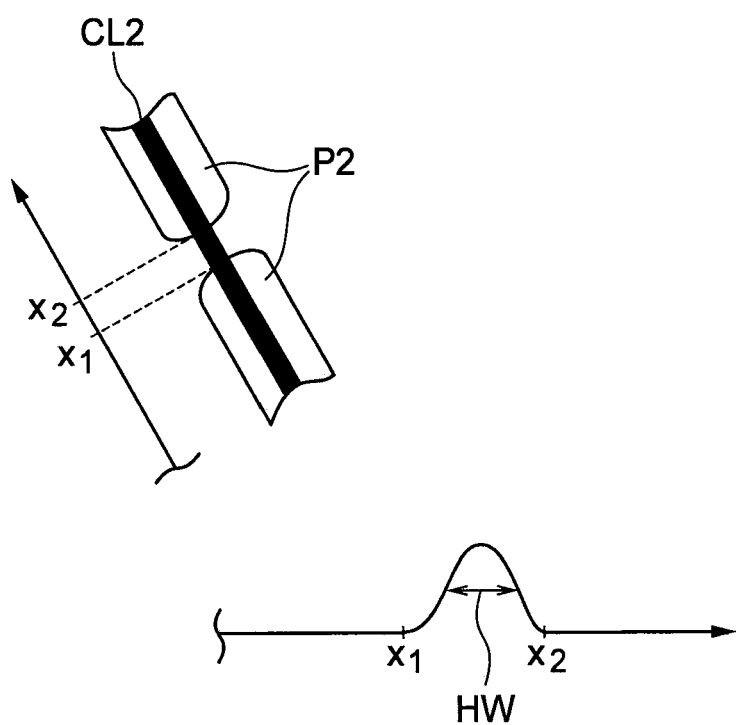
FIG. 8 is an explanatory diagram showing the relation between an open defect in the inspection target pattern and signal intensity.

For example, when an inspection target pattern P2 has an open defect between coordinate positions x1 and x2 as shown in the upper part of FIG. 8, signal intensity is generally high in this part, and the defect is therefore detected as a peak as shown in the lower part of FIG. 8. Thus, a detect having a size equal to the half-value width HW of the peak is detected as being located between the coordinate positions x1 and x2.

According to the present embodiment, defects are detected by the analysis of the one-dimensional signal waveform, so that there is no need to acquire an image of an evaluation target pattern. This enables a short-time defect inspection. Moreover, as there is no need to process a two-dimensional image, a load on a CPU for the defect detection processing can be reduced in the control computer 21.

(3) Second Embodiment of Pattern Defect Inspection Method

The open defects are detected in the convex patterns P1 to P10 in the case described by way of example in the first embodiment of the pattern defect inspection method. In the second embodiment, a method of detecting short defects that can be caused in a concave pattern is described.

In this case, the second embodiment is similar to the previously described embodiment in that electron beam irradiation point track data is generated from frame lines obtained by the distance transformation method. However, the second embodiment is different from the previously described embodiment in that frame lines are generated for a concave pattern portion. Moreover, in the present embodiment, portions a given distance or more apart from the proximate edge are at low risk of short defects, and are therefore judged to require no electron beam irradiation and excluded from the target for generating frame lines.

Figure 9:
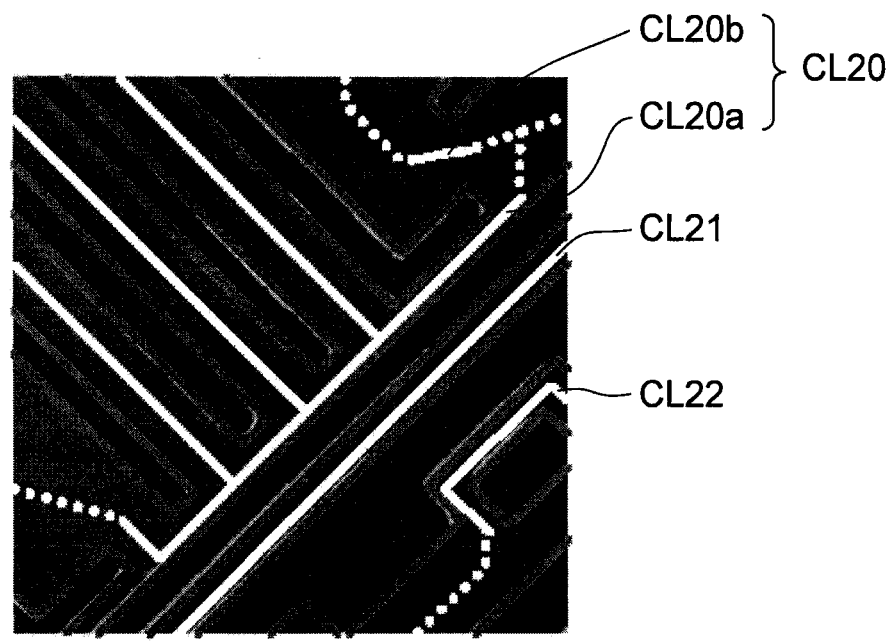
FIG. 9 is a diagram showing an example of frame lines generated for a concave pattern.

An example of frame lines thus generated for a concave pattern is shown in FIG. 9. Frame lines indicated by signs CL20 (CL20a and CL20b) to CL22 in FIG. 9 are generated from design data corresponding to the concave patterns P20 to P22 in FIG. 3. Parts indicated by dotted lines in FIG. 9 represent excluded frame lines.

Figure 10:
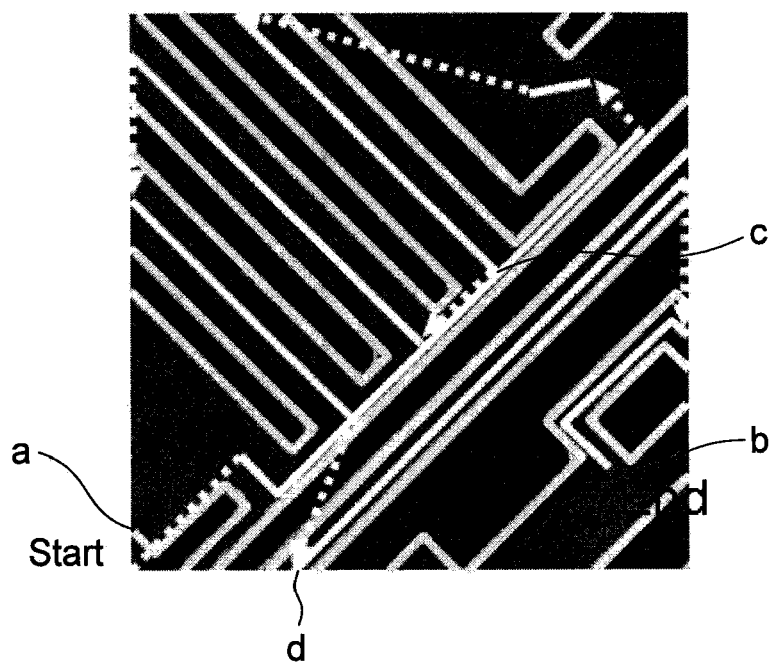
FIG. 10 is a diagram showing an example of tracks of electron beam irradiation points generated by connecting the frame lines shown in FIG. 9.

Thus, the portions which are well distant from the edges of the pattern and which are unlikely to cause short defects are excluded, and the inspection time is reduced accordingly. An example of tracks of electron beam irradiation points generated by connecting the frame lines shown in FIG. 9 is shown in FIG. 10. In the example of FIG. 10, a complex shape of a combination of straight line is generated as a result of connecting the frame lines. In this case, the pattern may be divided into parts and then scanned with an electron beam. In the example of FIG. 10, a scan is performed through two routes "a" to "b" and "c" to "d". Subsequently, defects can be detected by a procedure similar to that described above in the first embodiment.

Although inspections are separately conducted for the convex pattern and the concave pattern in the above-described inspection method, the invention does not have to be limited to this. Defect inspections may be simultaneously conducted for both the convex pattern and the concave pattern. In this case, defects can be independently defected in the convex pattern and the concave pattern, so that whether a defect is an open defect or a short defect can be easily determined. As a result, time and costs necessary to classify defects can be reduced.

The advantage of the present embodiment is that false defects are not easily generated because the electron beam is not irradiated to parts that require no electron beam irradiation. Another advantage is that the dose of the electron beam is restrained so that charging of the substrate 11 can be lessened and S/N is improved accordingly.

(4) Third Embodiment of Pattern Defect Inspection Method

In the examples shown in the first and second embodiments of the pattern defect inspection method described above, separate inspections are respectively conducted for the convex pattern and the concave pattern that are made of the common material and can be regarded as the same pattern as a whole. However, the bottom of a concave pattern differs in material from a convex pattern when common sidewalls serving as edges are used but the convex pattern is made of a material different from that of a film on which the convex pattern is formed. The present embodiment provides an inspection method for such a case where the bottom of a concave pattern differs in material from a convex pattern.

For example, when a metal wiring pattern is formed on an insulting film, a convex pattern made of a metal and a concave pattern having a bottom made of an insulating film are sequentially inspected. In this case, there is one method that changes electron beam irradiation conditions in accordance with the material of a pattern. For example, for a metal convex pattern, acceleration energy is set to 1.2 keV, a current amount is set to 3 pA, and a scan speed is set to a TV rate. When an electron beam is irradiated to the bottom of a concave pattern, for example, the acceleration energy is set to 0.8 keV, the current amount is set to 1 pA, and the scan speed is set to a TV/2.

The settings of the electron beam are thus changed in accordance with the material of the area to which the electron beam is irradiated, such that the influence of charging of the insulating film can be reduced, and a more accurate inspection can be conducted. At the same time, the focal position of the electron beam can be changed by controlling the objective lens 3 via the objective lens control section 43 to change the beam size. Moreover, a variably shaped beam may be generated by the unshown variably shaping aperture to change the shape of the electron beam in accordance with the material of the pattern.

(5) Fourth Embodiment of Pattern Defect Inspection Method

The aspects described in the first to third embodiments can be irradiated even to the complex pattern shown in FIG. 3. However, there is also an inspection target pattern such as a line-and-space (hereinafter simply referred to as L/S) pattern that is laid under a given rule. In this case, a set value that indicates the layout of the pattern is predetermined depending on the given rule. Thus, the present embodiment provides a method of generating electron beam irradiation point track data by use of such a set value in a simple manner.

Figure 11:
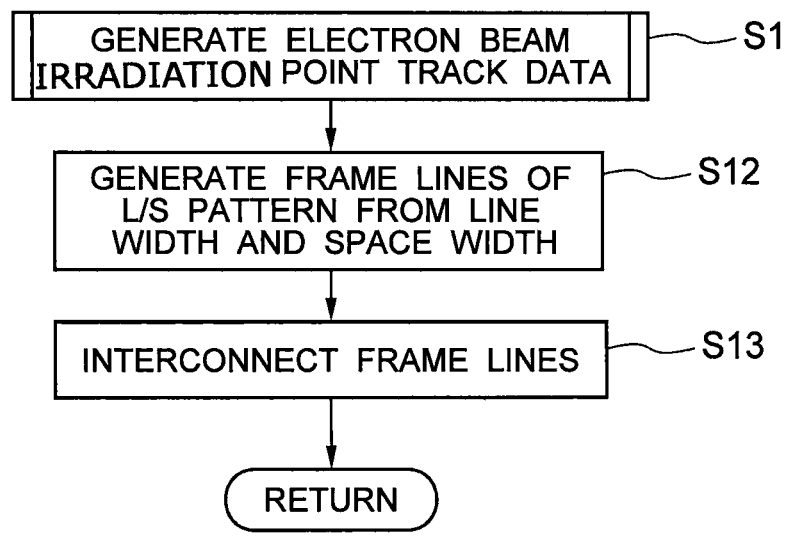
FIG. 11 is a flowchart showing a method of generating electron beam irradiation point track data used in a fourth embodiment of a pattern defect inspection method.
Figure 12:
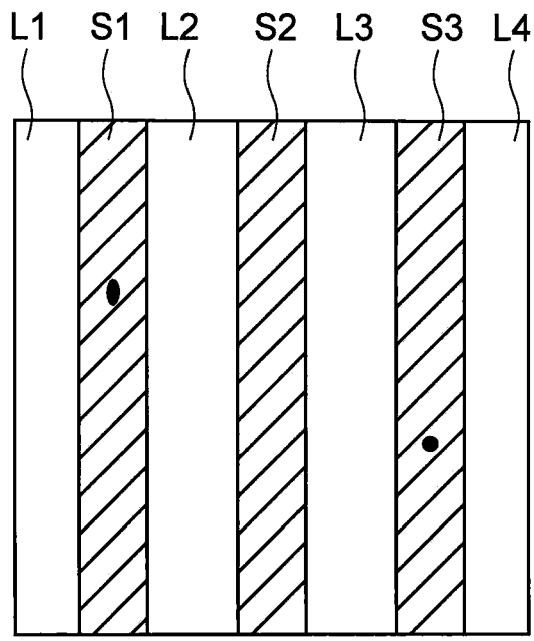
FIG. 12 is a diagram showing an example of an inspection target pattern suitable for the pattern defect inspection method shown in FIG. 11.

FIG. 11 is a flowchart showing the method of generating the electron beam irradiation point track data used in the present embodiment. FIG. 12 is a diagram showing an example of an inspection target pattern in the present embodiment. In FIG. 12, an L/S pattern comprising line patterns L1 to L4 and intervening space patterns S1 t0 S3 is shown. Each of the line patterns L1 to L4 has a line width of 20 nm, and each of the space patterns S1 t0 S3 has a space width of 30 nm.

Figure 13:
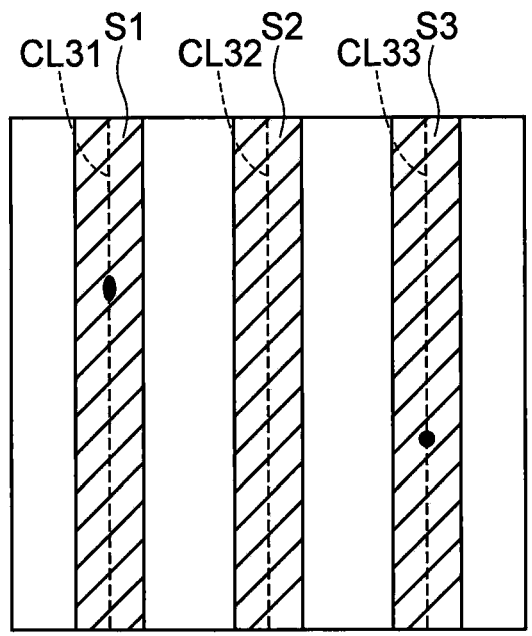
FIG. 13 is a diagram showing an example of frame lines generated for a space pattern in the inspection target pattern shown in FIG. 12.

First, the line width 20 nm and the space width 30 nm are input from the input device 20 as numerical values that describe the L/S pattern. As shown in FIG. 13, frame lines CL31 to CL33 of the space patterns S1 t0 S3 are generated by the above-described technique (step S12).

The frame lines CL31 to CL33 are then interconnected to generate electron beam irradiation point track data (step S13).

Furthermore, following the similar procedure described above with reference to FIG. 2, an electron beam is irradiated to the inspection target pattern in accordance with the electron beam irradiation point track data (FIG. 2, step S2). The CAD navigation technique, for example, can be used for positioning in this case in the same manner as described above.

Figure 14:
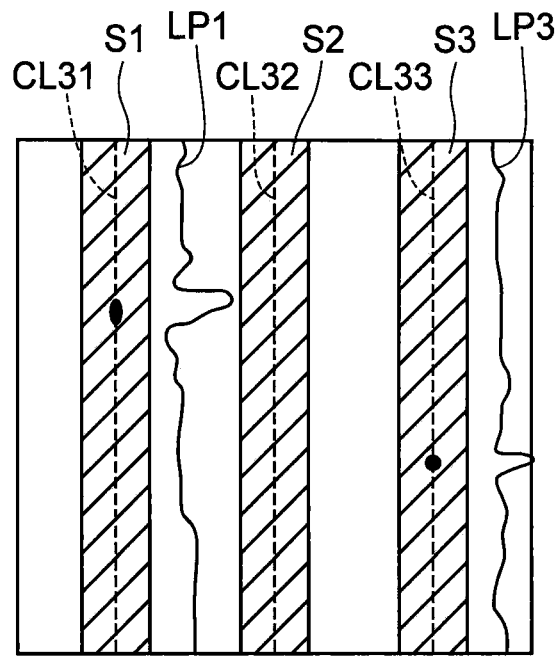
FIG. 14 is a diagram showing an example of one-dimensional signal waveform data generated for the space pattern in FIG. 12.

Secondary electrons generated from the surface of the inspection target pattern are then detected and processed such that one-dimensional signal waveform data indicated by signs LP1 to LP3 in FIG. 14 is obtained (FIG. 2, step S3).

Figure 15:
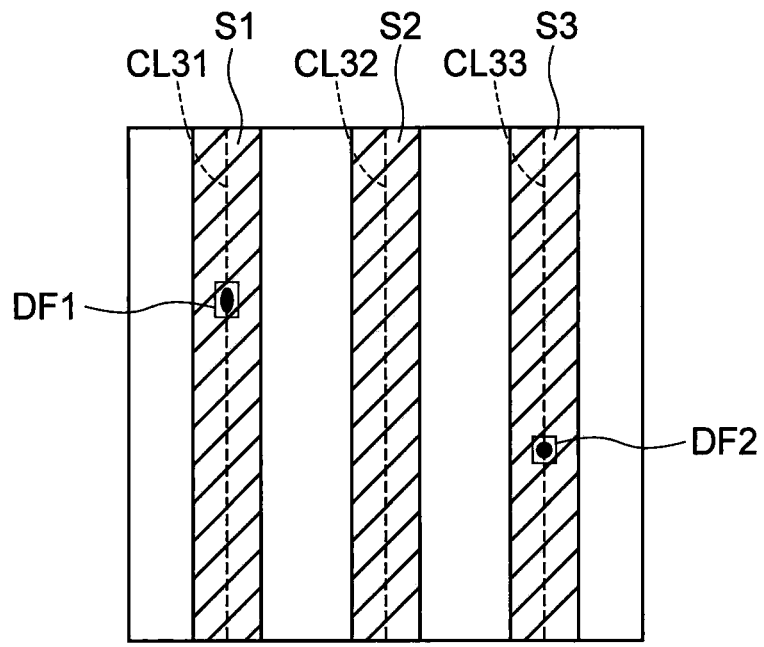
FIG. 15 is a diagram showing an example of pattern defects detected by the analysis of the signal waveform data shown in FIG. 14.

Finally, a peak is detected in the obtained signal waveform data, and defects DF1 and DF2 can be thereby detected as shown in FIG. 15 (FIG. 2, step S4).

(6) Second Embodiment of Pattern Defect Inspection Apparatus

Figure 16:
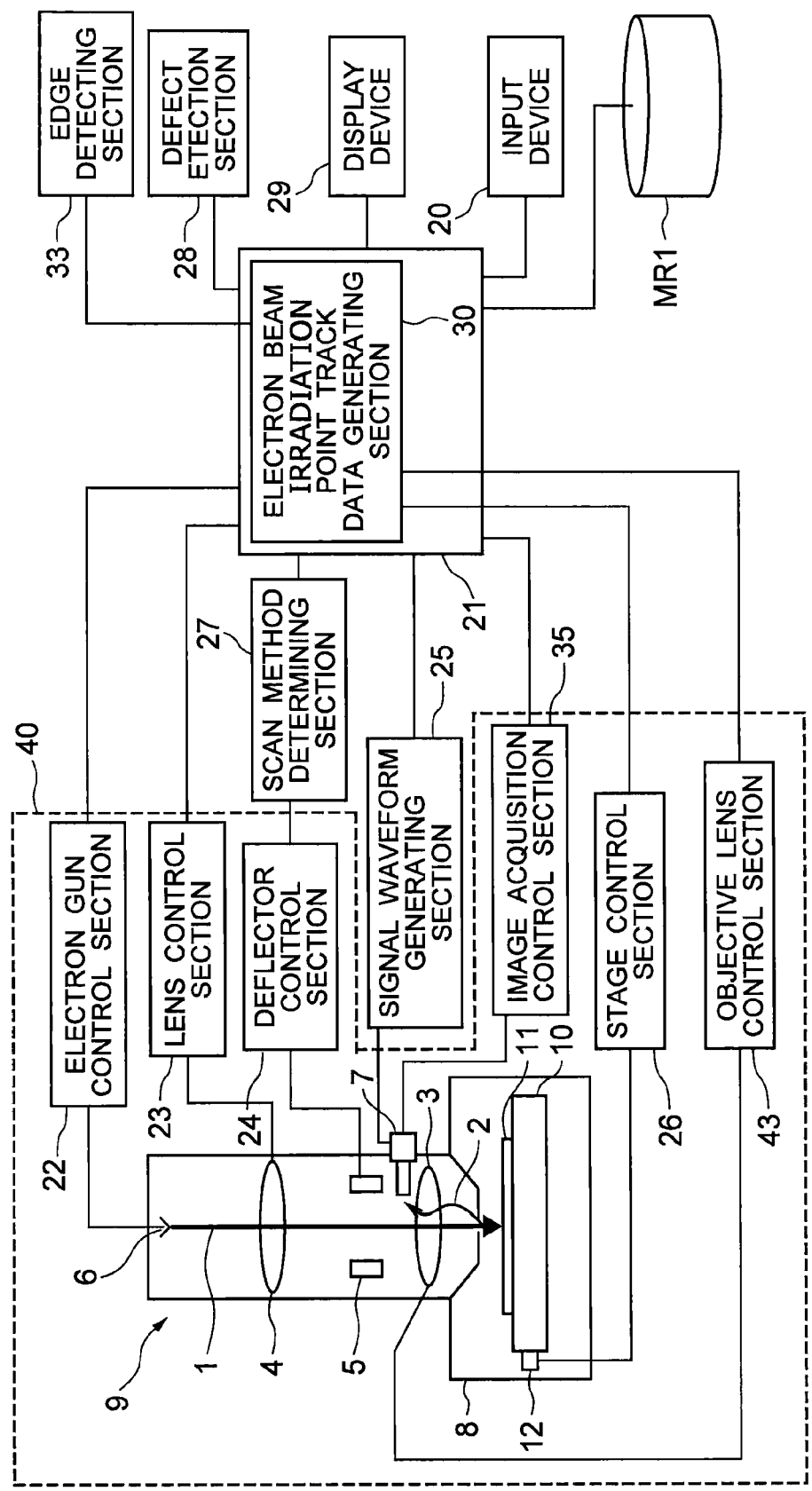
FIG. 16 is a block diagram showing a schematic configuration of a pattern defect inspection apparatus according to a second embodiment.

FIG. 16 is a block diagram showing a schematic configuration of a pattern defect inspection apparatus according to the second embodiment. The present embodiment is characterized in that edge data detected from an SEM image of an inspection target pattern is used instead of design data in generating electron beam irradiation point track data. The "edge" in the specification of the present irradiation refers to a part where brightness is locally changed in an image.

As apparent from the contract with FIG. 1, the pattern inspection apparatus shown in FIG. 16 comprises an edge detecting section 33 instead of the memory MR2 in which design data is stored, and further comprises an image acquisition control section 35. The image acquisition control section 35 is controlled by an instruction signal from the control computer 21. A detection signal is sent to the image acquisition control section 35 from the secondary electron detector 7, and the image acquisition control section 35 generates a two-dimensional SEM image of the inspection target pattern and sends the two-dimensional SEM image to the control computer 21. The control computer 21 sends the two-dimensional SEM image to the edge detecting section 33, and the edge detecting section 33 detects the edge of the inspection target pattern and sends edge data to an electron beam irradiation point track data generating section 30. The electron beam irradiation point track data generating section 30 uses the sent edge data to generate electron beam irradiation point track data.

(7) Fifth Embodiment of Pattern Defect Inspection Method

The pattern defect inspection method that uses the pattern defect inspection apparatus according to the present embodiment is different from the methods according to the first to fourth embodiments described above in that a process of converting edge data to GDS is added. The essential contents of the inspection are not different at all. However, in the process of converting edge data to GDS, it is necessary to correctly describe which corresponds to a convex pattern and which corresponds to a concave pattern among parts divided by edges. This identification cannot be achieved simply by performing the edge detection process.

Thus, as an example of a method of recognizing the inside and outside of a pattern, the present embodiment uses the following technique: An edge line group pair is generated. The edge line group pair comprises a combination of first and second edge line groups to be candidates for one and the other of an outer edge and an inner edge of an inspection target pattern. Shape matching is performed for each group pair, and a matching score thus obtained is used to determine the inner/outer edges. A method of generating electron beam irradiation point track data by use of this technique is specifically described with reference to FIG. 17 to FIG. 20.

Figure 17:
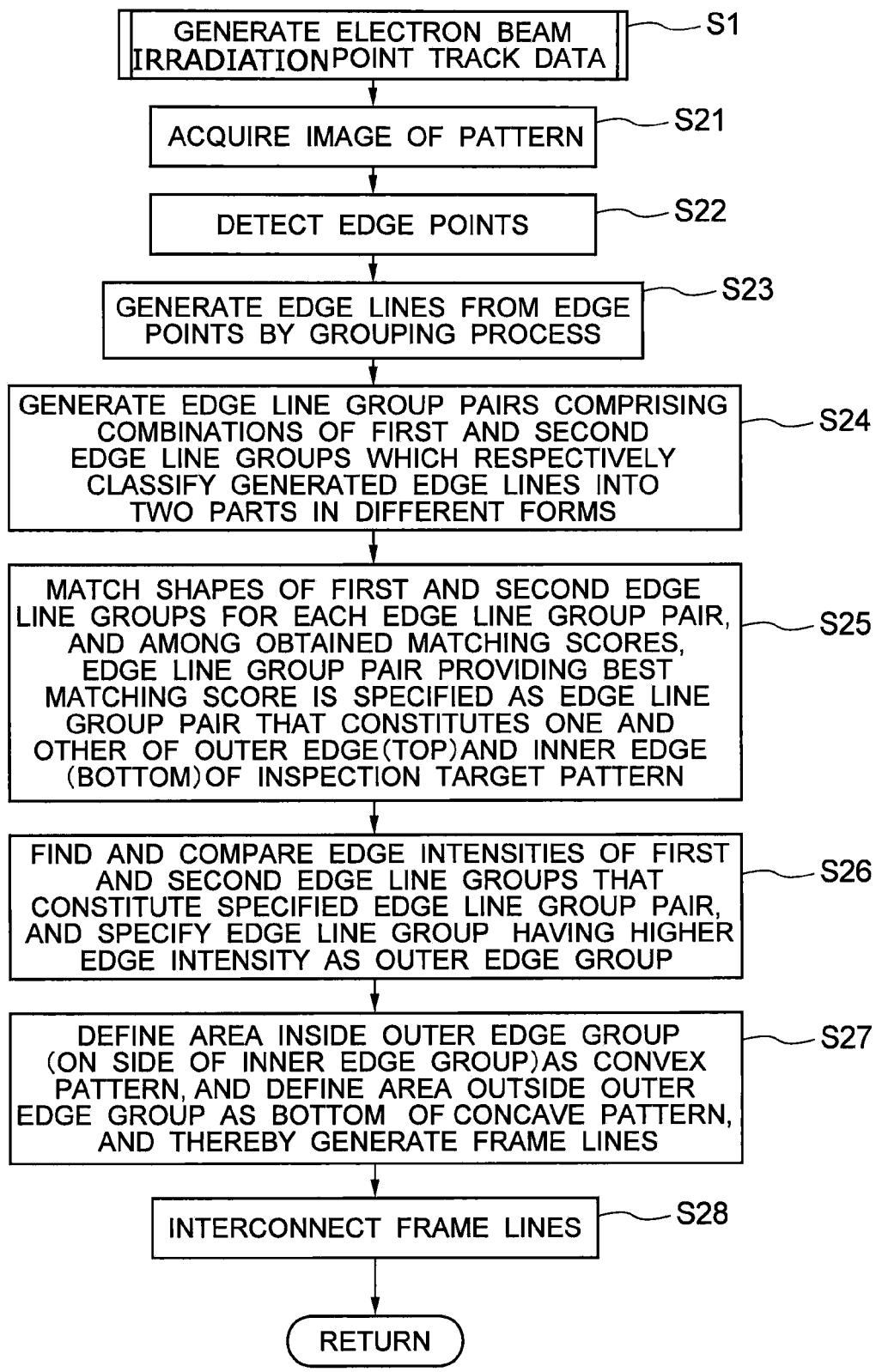
FIG. 17 is a flowchart showing a schematic procedure of a method of generating electron beam irradiation point track data according to a fifth embodiment of a pattern defect inspection apparatus.

FIG. 17 is a flowchart showing a schematic procedure of a method of generating electron beam irradiation point track data according to the present embodiment.

First, the scanning electron microscope 40 acquires image data for the inspection target pattern (step S21), and the edge detecting section 33 detects edge points in the image (step S22).

The detected edge points are then classified into groups of continuous edge lines by a grouping process such that edge lines are generated (step S23).

The electron beam irradiation point track data generating section 30 respectively combines the generated edge lines into two parts in different forms, thereby generating pairs of edge line groups (hereinafter simply referred to as "edge line group pairs") including first and second edge line groups (step S24).

Furthermore, the electron beam irradiation point track data generating section 30 matches the shapes of the first and second edge line groups for each of the edge line group pairs. Among the obtained matching scores, the electron beam irradiation point track data generating section 30 specifies the edge line group pair providing the best matching score as an edge line group pair that constitutes one and the other of an outer edge (top) and inner edge (bottom) of the inspection target pattern (step S25).

Moreover, the electron beam irradiation point track data generating section 30 finds and compares edge intensities of the first and second edge line groups that constitute the specified edge line group pair, and specifies the edge line group having a higher edge intensity as an outer edge group (step S26).

Subsequently, the electron beam irradiation point track data generating section 30 defines the specified outer edge group and the area inside the outer edge group (on the side of the inner edge group) as a convex pattern, and defines the area outside the outer edge group as the bottom of a concave pattern, thereby generating necessary frame lines (step S27).

Finally, the electron beam irradiation point track data generating section 30 interconnects the generated frame lines, and thereby generates electron beam irradiation point track data for the inspection target pattern (step S28).

Now, the above procedure is more specifically described with reference to FIG. 18 to FIG. 20.

Figure 18:
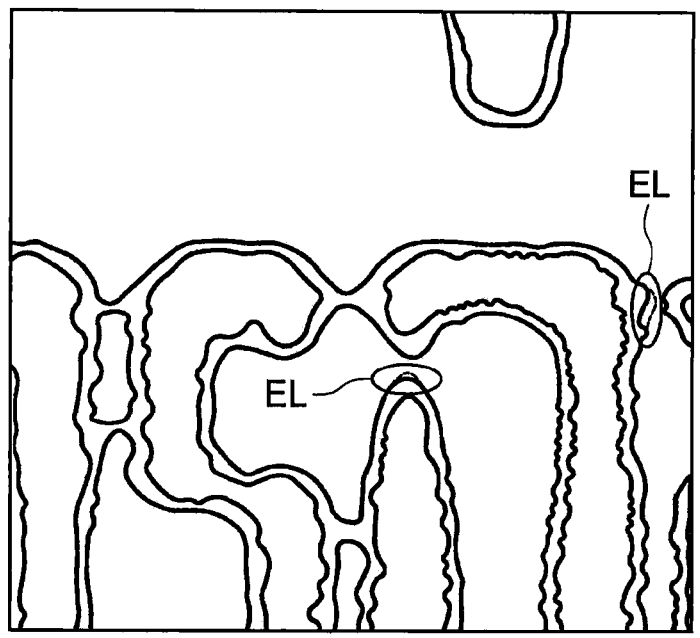
FIG. 18 is a diagram schematically showing an example of edge points detected from image data for an inspection target pattern.

FIG. 18 is a diagram schematically showing an example in which an SEM image of an inspection target pattern is acquired and edge points are detected from the image data. Solid lines in FIG. 18 represent a set of detected edge points. A broken line within an ellipse EL represents a set of pixels which is not detected as an edge.

In the present embodiment, a Sobel filter is used to detect edge points. The Sobel filter is a process of outputting a value which is the sum of results obtained by multiplying weighting factors for vertical and horizontal nine pixel values in the case of a size 3 around a given pixel of interest. In detecting edges, this process is carried out by using a coefficient matrix in vertical and horizontal two directions. The value obtained in this manner is recognized by a constant threshold to detect edge points.

As the detection of edge points is one of the most basic techniques in image processing, there have been suggested a considerably great number of techniques other than the Sobel filter. Here, any edge detecting method other than the Sobel filter may be used as long as the edge intensity of each edge point is output as a numerical value.

The grouping process in step S23 of FIG. 17 is a process of classifying detected edge points into continuous one group as an edge line. There are various other grouping processes than a method of simply specifying proximate edge points as the same group. For example, Japanese Patent Publication Laid-open No. 2005-296349 discloses a technique of linearly grouping edge points to extract edge lines.

Figure 19:
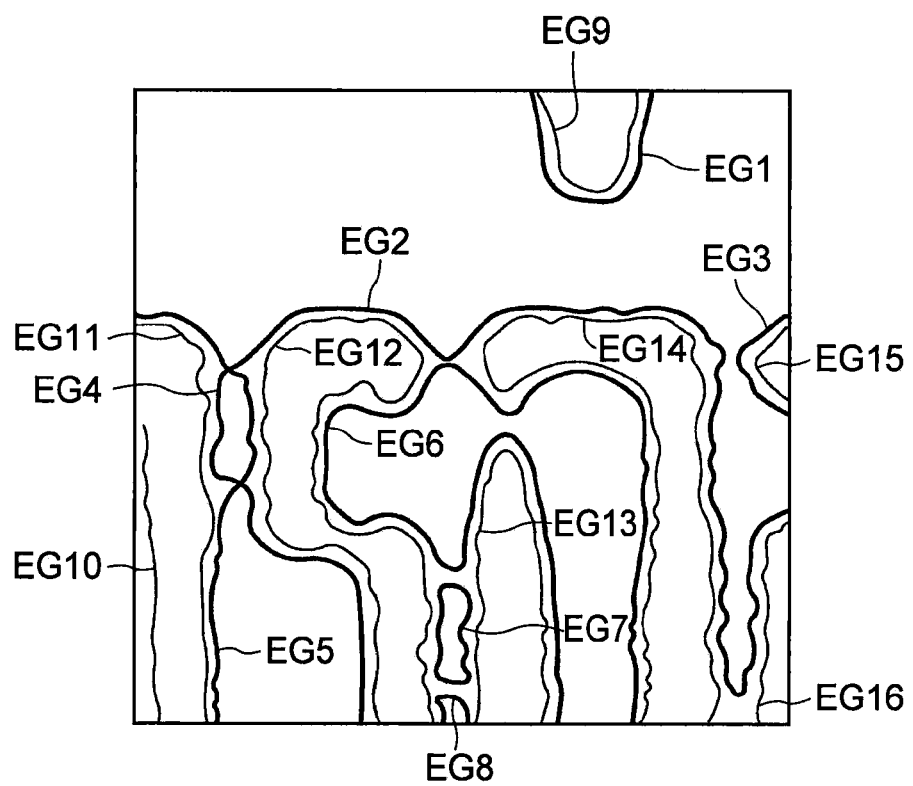
FIG. 19 is a schematic diagram only showing edge lines extracted by a grouping process of the edge points shown in FIG. 18.

FIG. 19 is a schematic diagram only showing edge lines extracted by the grouping process of the edge points shown in FIG. 18. In FIG. 19, sixteen edge lines are generated as indicated by the signs EG1 to EG16.

Now, the procedures in steps S24 and S25 in FIG. 17 are more specifically described.

In the edge line group generated in step S23, the inner edge located at the top of the pattern and the outer edge located at the bottom are mixed. Therefore, it is necessary to correctly recognize which edge line belongs to the inner edge group and which edge line belongs to the outer edge group, among the edge lines generated by the grouping process.

There are sixteen edge lines in the example shown in FIG. 19. Thus, when these edge lines are classified into the two inner edge and outer edge groups, $2^{16}$=65536 combinations are made by simple arithmetic.

In the present embodiment, a matching score obtained by matching the shapes of the inner edge group and the outer edge group is used as an index for judging the correctness of combinations. That is, on the assumption that the shapes of the inner edge group and the outer edge group are alike, a combination providing the best matching score is specified as a correct combination among all combinations of the two groups.

More specifically, in the procedure in step S24 of FIG. 17, the edge lines generated in step S23 are classified into two groups: a first edge line group and a second edge line group. These edge line groups are combined to generate an edge line group pair. In this case, the forms of the classification of the edge lines into two parts are changed to combine the edge line groups such that the edge line group pairs are generated. Here, the first edge line group is a candidate for one of the outer edge and inner edge of the inspection target pattern, and the second edge line group is a candidate for the other of the outer edge and inner edge of the inspection target pattern.

Furthermore, in the procedure in step S25 of FIG. 17, the shapes of the first edge line group and the second edge line that make each pair are matched for each of the generated edge line group pairs. Any technique may be used for the shape matching, and the matching score may be any value that corresponds to the technique.

FIG. 20 shows, by comparison, an example of correctly combined scores and an example of incorrectly combined scores among the matching scores of the respective edge line group pairs.

A shape conformity degree=0.533416 and a distribution value=70.099947 are obtained as matching scores for an edge line group pair which is a combination of the edge lines EG1 to EG8 belonging to a first group and the edge lines EG9 to EG16 belonging to a second group among the edge lines EG1 to EG16 in FIG. 18.

On the other hand, an example having a shape conformity degree=0.244051 and a distribution value=2460.834574 is shown as an incorrect combination in FIG. 20. It is obvious that the shape conformity degree is low and the distribution value is high. Thus, according to the present embodiment, a correct combination can be derived from a great number of combinations of the outer edge groups and the inner edge groups.

Although an edge line group pair of a correct combination can be specified by the above-described method that uses the score of the shape matching, this is not enough to know which edge line group is an outer edge group and which edge line group is an inner edge group between the first and second edge line groups that constitute the specified edge line group pair. Thus, in step S26, the respective edge intensities of the first and second edge line groups are first found. Here, the definition of the edge intensity may be not limited as long as the edge intensity is an index that indicates how clear the edge is, that is, how sharp the edge changes. For example, in the case of the edge detection by the Sobel filter, the respective edge intensities of two edge groups can be obtained by using an average value of output values (here, concentration values) of edge points which are obtained when a Sobel operator is performed and which belong to the edge groups.

In general, of the top edge and bottom edge of a pattern, the bottom edge is often clearer, so that the edge group having a higher edge intensity can be regarded as the outer edge group. Although the edge group having a higher edge intensity should be specified as the inner edge group depending on a product in some cases, the outer edges of the pattern, in the example of FIG. 19, the edge lines EG1 to EG8 are generally regarded as the outer shape of the pattern.

Furthermore, the edge lines EG1 to EG8 and the area inside these edge lines are defined as a convex pattern, and the area outside the edge lines EG1 to EG8 is defined as the bottom of a concave pattern, thereby generating necessary frame lines (step S27).

Finally, the generated frame lines are interconnected, and electron beam irradiation point track data for the inspection target pattern is thereby generated (step S28).

As described above, according to the present embodiment, electron beam irradiation point track data can be created without preparing information regarding an inspection target pattern such as design data and image data that is obtained from a nondefective.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the inventions.

The invention claimed is:

1. A pattern defect inspection method comprising;
generating a central line of a feature of an inspection target pattern based on first data on the inspection target pattern;
generating irradiation point track data for use in controlling scanning with an electron beam, based on the central line, the irradiation point track data comprising data on a track of irradiation points of the electron beam to the inspection target pattern;
irradiating the electron beam to the inspection target pattern in accordance with the irradiation point track data;
detecting secondary electrons generated from the inspection target pattern due to the irradiation of the electron beam;

acquiring second data representing one-dimensional intensity distribution of a signal of the detected secondary electrons; and detecting an abnormal point on the central line by analyzing the second data and outputting the abnormal point as a defect of the inspection target pattern.

2. The method according to claim 1, wherein:
the first data is design data for the inspection target pattern, and
the central line is generated based on the design data.

3. The method according to claim 1,
wherein the inspection target pattern is a pattern that is periodically arranged, and
the central line is generated based on a numerical value describing an arrangement of the pattern.

4. The method according to claim 1, wherein:
the first data is edge line data for the inspection target pattern, and
the central line is generated based on the edge line data.

5. The method according to claim 1,
wherein the irradiation point track data is generated by connecting central, lines proximate to each other.

6. The method according to claim 1,
wherein the inspection target pattern comprises at least one of a first pattern including a convex pattern and a second pattern including a concave pattern, the second pattern using an edge of the first pattern as a sidewall and using a space between the first patterns as a bottom.

7. The method according to claim 6,
wherein irradiating the electron beam includes setting different electron beam irradiation conditions for the first pattern and the second pattern, respectively.

8. The method according to claim 6,
wherein generating the irradiation point track data includes calculating a distance between a central line of the second pattern and an edge proximate to the central line of the second pattern among edges of the second pattern, and
among edges of the second pattern, the irradiation of the electron beam to such a part of the second pattern that the distance is equal to or less than a given threshold is omitted.

9. The method according to claim 1,
wherein irradiating the electron beam includes changing at least one of a shape or a size of the electron beam depending on a material of a pattern.

10. The method according to claim 3,
wherein the abnormal point is detected through a peak detection of the second data.

11. A pattern defect inspection apparatus comprising:
an irradiation point track data generating unit configured to:
  generate a central line of a feature of the inspection target pattern based on first data on the inspection target pattern; and
  generate irradiation point track data for use in controlling scanning with an electron beam based on the central line, the irradiation point track data comprising data on a track of points of irradiation of the electron beam to the inspection target pattern;
an electron beam irradiation unit configured to irradiate the electron beam to the inspection target pattern in accordance with the irradiation point track data;
a secondary electron detection unit configured to detect secondary electrons generated from the inspection target pattern due to the irradiation of the electron beam;

a signal intensity acquisition unit configured to acquire second data representing one-dimensional intensity distribution of an output signal from the secondary electron detection unit; and
a defect detection unit configured to detect an abnormal point on the central line by analyzing the second data and output the abnormal point as a defect of the inspection target pattern.

12. The apparatus of claim 11, wherein:
the first data is design data for the inspection target pattern, and
the irradiation point track data generating unit generates the central fine based on the design data.

13. The apparatus of claim 11,
wherein the inspection target pattern is a pattern that is periodically arranged, and
the irradiation point track data generating unit generates the central line based on a numerical value describing an arrangement of the pattern.

14. The apparatus of claim 11, wherein:
the first data is edge line data for the inspection target pattern, and
the irradiation point track data generating unit generates the central line based on the edge line data.

15. The apparatus of claim 11,
wherein the irradiation point track data generating unit generates the irradiation point track data by connecting central lines proximate to each other.

16. The apparatus of claim 11,
wherein the inspection target pattern comprises at least one of a first pattern including a convex pattern and a second pattern including a concave pattern, the second pattern using an edge of the first pattern as a sidewall and using a space between the first patterns as a bottom.

17. The apparatus of claim 16,
wherein the electron beam irradiation unit sets different electron beam irradiation conditions for the first pattern and the second pattern, respectively.

18. The apparatus of claim 17,
wherein the irradiation point track data generating unit calculates a distance between a central line of the second pattern and an edge proximate to the central line of the second pattern among edges of the second pattern, and
the irradiation point track data generating unit omits the irradiation of the electron beam to such a part of the second pattern that the distance is equal to or less than a given threshold.

19. The apparatus of claim 11,
wherein the electron beam irradiation unit changes at least one of a shape or a size of the electron beam depending on a material of a pattern.

20. The apparatus of claim 13,
wherein the defect detection unit detects the abnormal point through a peak detection of the second data.

21. The method according to claim 1,
wherein the second data is a sequential gray value data obtained from the detected secondary electrons, and
the abnormal point is detected by use of data other than an image of the inspection target pattern.

22. A pattern defect inspection apparatus comprising:
an irradiation point track data generating unit configured to:
  generate a central line of a feature of the inspection target pattern based on data on the inspection target pattern; and
  generate irradiation point track data for use in controlling scanning with an electron beam based on the central line, the irradiation point track data comprising data on a track of points of irradiation of the electron beam to the inspection target pattern;

an electron beam irradiation unit configured to irradiate the electron beam to the inspection target pattern in accordance with the irradiation point track data;

a secondary electron detection unit configured to detect secondary electrons generated from the inspection target pattern due to the irradiation of the electron beam;

a signal intensity acquisition unit configured to acquire a sequential gray value data from an output signal from the secondary electron detection unit; and a defect detection unit configured to detect an abnormal point on the central line by analyzing the sequential gray value data and output the abnormal point as a defect of the inspection target pattern.

* * * * *